United States Patent
Moroz et al.

(10) Patent No.: US 11,177,317 B2
(45) Date of Patent: Nov. 16, 2021

(54) POWER HARVESTING FOR INTEGRATED CIRCUITS

(71) Applicant: Synopsys, Inc., Mountain View, CA (US)

(72) Inventors: Victor Moroz, Saratoga, CA (US); Jamil Kawa, Campbell, CA (US)

(73) Assignee: Synopsys, Inc., Mountain View, CA (US)

( * ) Notice: Subject to any disclaimer, the term of this patent is extended or adjusted under 35 U.S.C. 154(b) by 359 days.

(21) Appl. No.: 15/479,140

(22) Filed: Apr. 4, 2017

(65) Prior Publication Data

US 2017/0287977 A1   Oct. 5, 2017

Related U.S. Application Data

(60) Provisional application No. 62/318,108, filed on Apr. 4, 2016.

(51) Int. Cl.
*H01L 27/16* (2006.01)
*H01L 35/10* (2006.01)
(Continued)

(52) U.S. Cl.
CPC ............... *H01L 27/16* (2013.01); *H01L 35/10* (2013.01); *H01L 35/32* (2013.01); *H01L 35/34* (2013.01); *H01L 35/18* (2013.01); *H01L 35/22* (2013.01)

(58) Field of Classification Search
CPC ......... H01L 35/00; H01L 35/10; H01L 35/28; H01L 35/32; H01L 23/38; H01L 27/16;
(Continued)

(56) References Cited

U.S. PATENT DOCUMENTS 5,318,743 A * 6/1994 Tokiai ..................... H01L 35/16
257/64
5,419,780 A   5/1995 Suski
(Continued)

FOREIGN PATENT DOCUMENTS

| JP | 2007095897 A * | 4/2007 | |
| WO | WO-2010010520 A2 * | 1/2010 | ............. H01L 35/34 |
| WO | 2017/023654 A1 | 2/2017 | |

OTHER PUBLICATIONS

English machine translation of JP2007095897A (Year: 2007).*

*Primary Examiner* — Andrew J Golden
(74) *Attorney, Agent, or Firm* — Haynes Beffel & Wolfeld LLP; Andrew L. Dunlap

(57) ABSTRACT

Integrated circuit devices which include a thermoelectric generator which recycles heat generated by operation of an integrated circuit, into electrical energy that is then used to help support the power requirements of that integrated circuit. Roughly described, the device includes an integrated circuit die having an integrated circuit thereon, the integrated circuit having power supply terminals for connection to a primary power source, and a thermoelectric generator structure disposed in sufficient thermal communication with the integrated circuit die so as to derive, from heat generated by the die, a voltage difference across first and second terminals of the thermoelectric generator structure. A powering structure is arranged to help power the integrated circuit, from the voltage difference across the first and second terminals of the thermoelectric generator. The thermoelectric generator can include IC packaging material that is made from thermoelectric semiconductor materials.

21 Claims, 9 Drawing Sheets

(51) Int. Cl.
  *H01L 35/32* (2006.01)
  *H01L 35/34* (2006.01)
  *H01L 35/18* (2006.01)
  *H01L 35/22* (2006.01)

(58) Field of Classification Search
  CPC ......... H01L 35/18; H01L 35/22; H01L 35/34; H05K 2201/10219
  USPC .................................................. 136/200–242
  See application file for complete search history.

(56) References Cited

U.S. PATENT DOCUMENTS

| | | | | |
|---|---|---|---|---|
| 5,956,569 | A * | 9/1999 | Shiu | H01L 23/38 |
| | | | | 136/200 |
| 6,096,967 | A * | 8/2000 | Ollero Velasco | H01L 35/00 |
| | | | | 136/205 |
| 2005/0077619 | A1 * | 4/2005 | Ramanathan | H01L 23/38 |
| | | | | 257/719 |
| 2005/0161072 | A1 * | 7/2005 | Esser | H01L 35/32 |
| | | | | 136/205 |
| 2006/0086118 | A1 | 4/2006 | Venkatasubramanian et al. | |
| 2007/0095381 | A1 * | 5/2007 | Lee | H01L 35/32 |
| | | | | 136/230 |
| 2009/0283124 | A1 * | 11/2009 | Seo | F03G 7/06 |
| | | | | 136/201 |
| 2010/0154855 | A1 * | 6/2010 | Nemir | H01L 35/30 |
| | | | | 136/205 |
| 2010/0163090 | A1 * | 7/2010 | Liu | H01L 35/32 |
| | | | | 136/224 |
| 2010/0219525 | A1 * | 9/2010 | Ibaraki | H01L 35/32 |
| | | | | 257/693 |
| 2011/0095437 | A1 * | 4/2011 | Felk | H01L 25/0657 |
| | | | | 257/774 |
| 2012/0180839 | A1 * | 7/2012 | Hedler | G01J 5/12 |
| | | | | 136/201 |
| 2012/0204577 | A1 * | 8/2012 | Ludwig | H01L 23/38 |
| | | | | 62/3.3 |
| 2013/0168798 | A1 * | 7/2013 | Chang | H01L 23/38 |
| | | | | 257/467 |
| 2014/0014154 | A1 * | 1/2014 | Hayashi | H01L 35/32 |
| | | | | 136/205 |
| 2014/0252531 | A1 * | 9/2014 | Aryan | H01L 35/32 |
| | | | | 257/467 |
| 2016/0027717 | A1 * | 1/2016 | Jang | H01L 23/38 |
| | | | | 361/718 |

* cited by examiner

POWER HARVESTING FOR INTEGRATED CIRCUITS

CROSS REFERENCE TO RELATED APPLICATION

This application claims priority under 35 U.S.C. § 119(e) to U.S. Provisional Application No. 62/318,108, entitled "Harvesting Chip Self-Heating", filed on Apr. 4, 2016, by Victor Moroz and Jamil Kawa, the entire contents of which are hereby incorporated by reference herein.

FIELD OF THE TECHNOLOGY DISCLOSED

The present invention is in the field of integrated circuit packaging, and more particularly the use of thermoelectric packaging materials to help power the enclosed integrated circuit.

BACKGROUND

Integrated circuits (ICs) used in Internet of Things (IoT) applications often rely on sources of electrical energy such as a small battery or super capacitor having limited energy storage capacity. The energy source may be recharged from an inconsistent power source, such as solar cells. IoT ICs often are designed to consume low power, in order that they can operate for longer periods of time. But at some point either larger batteries, or external power sources are needed. It would be advantageous to find ways to extend the battery life of IoT devices without having to rely on larger batteries or continued development of low power integrated circuit technology.

SUMMARY

An integrated circuit (IC) is a set of electronic circuits that integrates a large numbers of semiconducting transistors into a small chip. Among the most advanced integrated circuits are the microprocessors, memory chips, programmable logic sensors, power management circuits, etc.

Integrated circuits fabricated on semiconductor chips generate heat during normal operation. If the heat generated becomes excessive or the heat generated is not effectively removed, the IC device can malfunction or fail. In other words, the reliability of the IC device may be compromised if the IC device overheats. Advances in IC technology have led to faster clock frequencies and greater densities of transistors in the IC chips. These advances have resulted in a corresponding increase in the amount of heat generated by the IC chips. With large amounts of heat being generated, the problem of efficient heat dissipation has become more acute. Furthermore, the increased density in chips produces problems due to local heating and thermally induced stress which can deteriorate chip performance and longevity. During operation, ICs generate heat from Joule heating. This effect is also known as IC self-heating. In general, the optimum heat removal scheme from the IC device is determined by the amount of heat dissipated by the IC device, the IC package configuration and the expected lifetime of the IC device combined with many other factors.

A thermoelectric generator is a semiconducting device that converts heat flux (temperature differences) directly into electrical energy through a phenomenon called the Seebeck effect. In an aspect of the invention, a thermoelectric generator is used to harvest heat generated by the self-heating of an integrated circuit chip, and to convert it to electrical energy to help power the chip. Thus, the use of thermoelectric materials in chip packaging can help address both the thermal management as well as power management problems.

Disclosed herein are integrated circuit devices which include a thermoelectric generator which recycles heat generated by operation of an integrated circuit, into electrical energy that is then used to help support the power requirements of that integrated circuit. Roughly described, the device includes an integrated circuit die having an integrated circuit thereon, the integrated circuit having power supply terminals for connection to a primary power source, and a thermoelectric generator structure disposed in sufficient thermal communication with the integrated circuit die so as to derive, from heat generated by the die, a voltage difference across first and second terminals of the thermoelectric generator structure. A powering structure is arranged to help power the integrated circuit, from the voltage difference across the first and second terminals of the thermoelectric generator. The thermoelectric generator can include IC packaging material that is made from thermoelectric semiconductor materials. The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The invention will be described with respect to specific embodiments thereof, and reference will be made to the drawings, in which.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
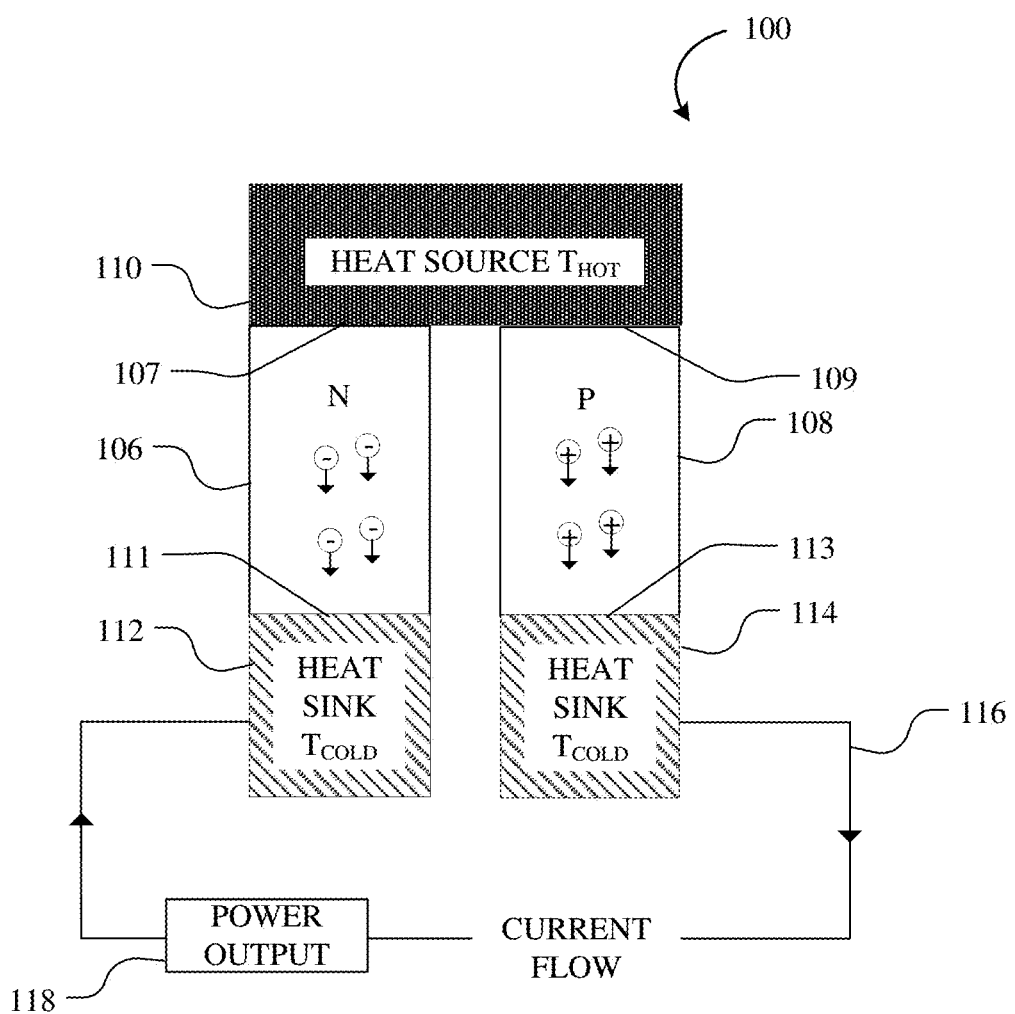
FIG. 1 illustrates a conventional prior art thermoelectric generator 100 for converting heat into electrical energy.

FIG. 1 illustrates a conventional prior art thermoelectric generator 100 for converting heat into electrical energy. The thermoelectric generator 100 comprises an N-type thermoelectric material 106 and a P-type thermoelectric material 108. In N-type materials, negative electrons are the majority electric charge carriers. In P-type materials, positive holes are the majority electric charge carriers.

The thermoelectric materials 106 and 108 are electrically interconnected at respective second ends 107, 109 by a heat source 110 at temperature $T_{HOT}$. The heat source 110 can itself be a heat-generating device or be immediately adjacent to a heat-generating device. The thermoelectric materials 106 and 108 are also connected to respective heat sinks 112 and 114 at their respective first ends 111, 113. The heat sinks 112 and 114 are at temperature $T_{COLD}$ and dissipate heat into the surrounding environment, thereby avoiding back flow of heat from the heat sinks 112 and 114 to the heat source 110.

N-type thermoelectric material 106 and P-type thermoelectric material 108 are made of semiconducting materials with high electrical conductivity and low thermal conductivity. When the temperature $T_{HOT}$ of the heat source 110 is higher than the temperature $T_{COLD}$ of the heat sinks 112 and 114, the lower thermal conductivity of the thermoelectric materials create a temperature difference, $T_{HOT}$-$T_{COLD}$, across the two ends of thermoelectric materials 106 and 108. A temperature gradient results. The temperature gradient in the N-type thermoelectric material 106 enables the warmer electrons near the heat source 110 to flow toward the cooler region of the heat sink 112, creating an internal electric voltage difference across the N-type thermoelectric material 106. Similarly, warmer holes near the heat source 110 in the P-type thermoelectric material 108 flow toward the cooler region of the heat sink 114, creating a secondary internal electric voltage difference. The high electrical conductivity in the thermoelectric materials aid the flow of electric charge carriers from the heat source 110 to the heat sinks 112 and 114.

The present discussion uses the convention that the "current flow direction" is opposite the direction of flow of electrons. It will be understood that this is merely a terminology convention, and another description of the same device could refer to the "current flow direction" as being the same direction as the flow of electrons.

Using the convention of the present description, the electron flow in the N-type thermoelectric material 106 and hole flow in the P-type thermoelectric material 108 generate a flow of current in clockwise direction from heat sink 112 to heat sink 114. A pair of wires 116 connects the two heat sinks 114 and 112 with a power output component 118 to complete the circuit of the thermoelectric generator 100. The power output component 118 can be a resistor. The power output component 118 can also be a battery, a capacitor or a supercapacitor that stores the electrical energy generated by the thermoelectric generator 100. The amount of power collected from the thermoelectric generator 100 is roughly proportional to the temperature difference between the heat source 110 and the heat sinks 112 and 114.

Figure 2:
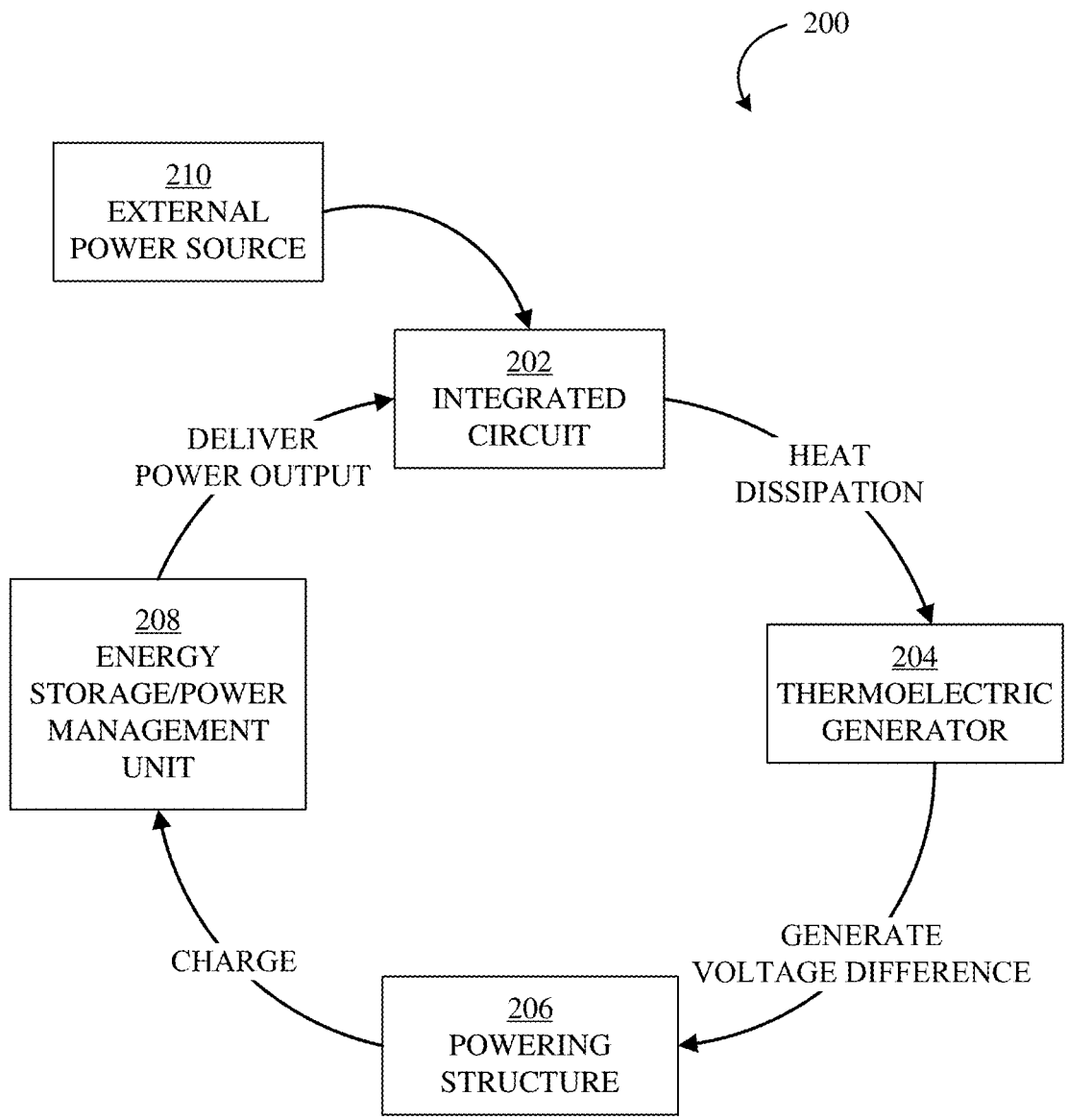
FIG. 2 is an overall diagram of a thermoelectric IC device 200 incorporating features of the invention.

FIG. 2 is an overall diagram of the operation of a thermoelectric device 200 incorporating features of the invention. The device comprises an IC 202 formed on an integrated circuit die, a thermoelectric generator 204, a powering structure 206, an optional energy storage component 208, and an external power source 210.

When IC 202 dissipates heat, thermoelectric generator 204, thermally connected with the IC die at a second end and to a cooler environment at a first end, generates a voltage difference in response to the heat from the die. As used herein, no distinction is intended between features of an integrated circuit which are disposed in the substrate body itself, or disposed in an overlying layer. For example, all of the features of an integrated circuit, including wells, diffusions, shallow trench isolation (STI) regions, gate dielectric layers, gate conductors and cap layer materials and interconnects, are all described equivalently herein as being either "on" the die or "in" the die, and no distinction is intended between the two words.

A powering structure 206 charges the energy storage component 208 from the voltage difference generated across first and second ends of the thermoelectric generator structure 204. The energy storage component 208 delivers the converted electrical power back to the IC 202. The IC 202 utilizes the electrical power provided by the energy storage component 208 to help support its normal operation. The power supplied to the IC 202 by the energy storage component 208 supplements the power supplied by external power source 210, thereby reducing the demand on the external power source 210 and potentially extending the powered life of the device.

The powering structure 206 may include conductors, positive electrodes, negative electrodes, and through-silicon vias (TSVs). A TSV is a conductive post that extends all the way through the IC die, from the topside surface to the backside surface or vice versa. The conductor in the TSV is typically copper or another metal such as tungsten, and it is typically isolated from the substrate along its entire length by a dielectric or other barrier material. TSVs are an electrical interconnect technique sometimes utilized as an alternative to wire-bond and flip chips.

The energy storage component 208 may be a battery or a capacitor, which may be a supercapacitor. A capacitor is a two-terminal (positive terminal and negative terminal) electrical component that stores electrical energy. A supercapacitor is a high-capacity capacitor that typically stores 10 to 100 times more electrical energy than normal capacitors. Supercapacitors can charge and discharge much faster than batteries and normal capacitors. The supercapacitors described in PCT publication No. WO 2017/023654A1, entitled "2D Material Super Capacitors", incorporated herein by reference, are examples of capacitors that can be used to implement energy storage component 208.

The energy storage component 208 can also work in conjunction with a power management unit. The power management unit can be part of the circuitry of the IC 202. The power management unit can also be located outside the IC die. The power management unit manages the power supply of the IC 202. The power management unit receives the electrical power needed for the IC's operation at power supply terminals connected to the external power source 210, and at power support terminals connected to receive charge from the powering structure 206. In one embodiment, the power supply terminals include positive and negative terminals which are the same as positive and negative power support terminals. In another embodiment, one or both of the terminals can be different. If so, then the integrated circuit can include a voltage converter to convert the voltage developed across the power support terminals, to a range usable by the remainder of the integrated circuit 202. An example of a voltage converter is a switched capacitor circuit, which relies on alternately connecting capacitors to the input and output in differing topologies. For example, a voltage doubler might charge two capacitors in parallel from the input source and then reconnect them together in series to output double the voltage at roughly half the current.

Figure 3:
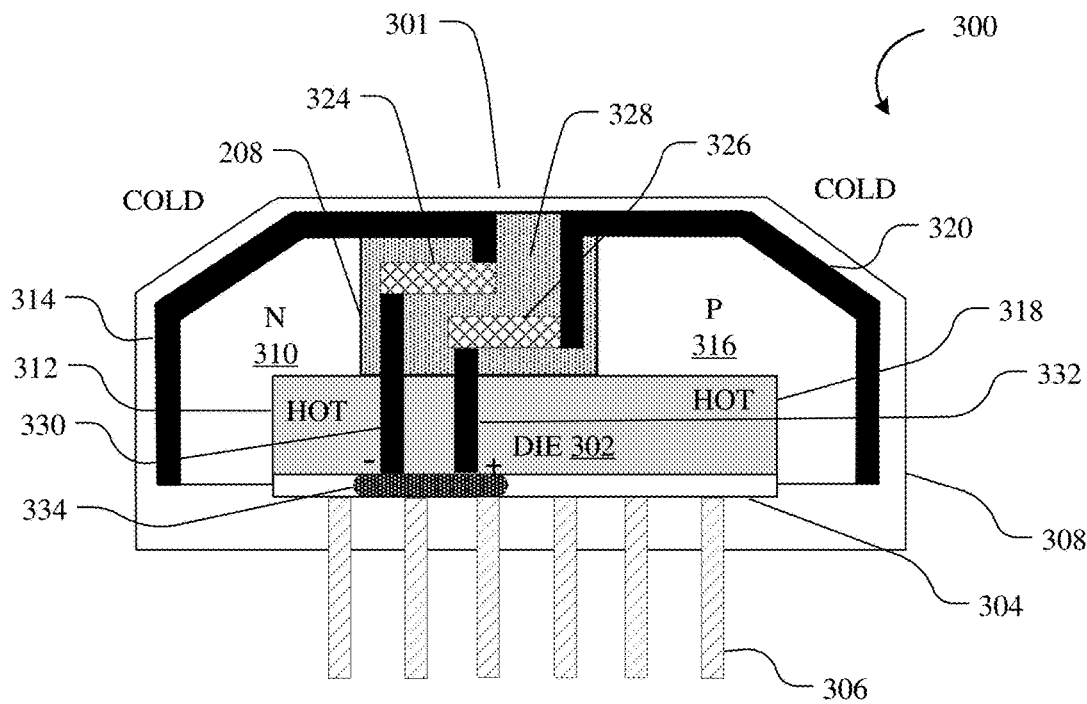
FIG. 3 is a cross sectional view symbolically illustrating a first example thermoelectric IC device 300 with packaging formed by first and second thermoelectric materials (N-type and P-type).

FIG. 3 is a cross sectional view illustrating a first example thermoelectric IC device 300 having a package body 301. The package body 301 includes first and second thermoelectric materials (N-type and P-type) 310 and 316, separated by a dielectric material 328. The thermoelectric IC device 300 contains a die 302 within a recess of the package body 301. A die 302 is a small block of semiconducting material, on which a given integrated circuit 202 is fabricated on the front side of the die 304 (face down in the drawing). The electrical contacts 306 (also called "pins" or "terminals") make electrical contact between the semiconductor die 302 and the printed circuit board (PCB) located outside the thermoelectric IC device 300. The electrical contacts 306 transfer electrical signals into and out of the thermoelectric IC device 300.

The thermoelectric IC device 300 is optionally encapsulated within a dielectric layer 308. The dielectric layer 308 prevents physical damage and corrosion of the IC die 302. The dielectric layer 308 provides an airtight seal to keep out moisture. The dielectric layer 308 also provides effective heat dissipation away from the die.

Silicon is an efficient heat conductor, dispersing heat in a uniform fashion within the die 302, for dissipation into the external environment. The bulk thermal conductivity κ of silicon is ~150 W/m·K. Typical dielectric layer 308 materials are either plastic or ceramic, with bulk thermal conductivity which is $1/300$ to $1/3$ that of silicon. For example, alumina has a thermal conductivity κ of ~20 W/m·K, glass has a thermal conductivity κ of ~0.8 W/m·K, and LTCC (low temperature co-fired ceramic) has a thermal conductivity κ of ~3 W/m·K.

The package body inside the thermoelectric IC device 300 has a first portion of a first thermoelectric material 310 and a second portion of second thermoelectric material 316. A thermoelectric material with a lower thermal conductivity than the thermal conductivity of silicon is chosen. This produces a temperature gradient across each of the first and second thermoelectric materials, and an amount of electric charge collected from the thermoelectric IC device 300 is roughly proportional to the temperature gradient from a hot side of the thermoelectric IC package body (at the die 302) to a cooler side of the thermoelectric IC package body 300 (at the outer surface of the body). However, the thermal conductivity of the first and second thermoelectric materials should remain high enough to prevent overheating the IC. For low-power IoT ICs, a thermoelectric IC package material having a thermal conductivity $1/300$ to $1/3$ that of silicon is suitable for these dual purposes.

Semiconductor materials with thermal conductivity $1/300$ to $1/3$ that of the thermal conductivity of Silicon include SiGe with a thermal conductivity κ of ~13 W/m·K, SiC with a thermal conductivity κ of ~16 W/m·K, InP with a thermal conductivity κ of ~68 W/m·K, GaN with a thermal conductivity κ of ~40 W/m·K, polysilicon with a thermal conductivity κ of ~5 to ~50 W/m·K depending on doping, and GaAs with a thermal conductivity κ of ~46 W/m·K.

A thermoelectric package body inside the thermoelectric IC device may not convert the heat dissipated by the die 302 into electric energy with the efficiency anywhere close to 100%. However, a 10% to 30% conversion efficiency by the thermoelectric generator 204 may facilitate extended operation of IoT ICs.

A typical IoT IC operates in short bursts, consuming power of the order of 1 W for a short period to perform sensing, data processing, and communication, and then becomes idle for prolonged periods before the next burst of activity. A thermoelectric material having thickness d=0.5 mm (i.e. distance from die 302 to the external surface of the thermoelectric IC package) and having thermal conductivity of 20 W/m·K generates a temperature gradient across the thermoelectric material of $\Delta T = P/k \cdot d = 1$ W/(20 W/m·K·0.5e-3 m)=100 K. For an IoT chip with lower power consumption, a thermoelectric material that is thinner and/or has lower thermal conductivity may be utilized to maintain the temperature gradient within the acceptable range.

Referring to FIG. 3, the package body of the thermoelectric IC device 300 comprises an N-type thermoelectric material 310 and a P-type thermoelectric material 316. The N-type thermoelectric material 310 and a P-type thermoelectric material 316 are semiconductors with thermal conductivity $1/300$ to $1/3$ that of the thermal conductivity of Silicon. The thermoelectric semiconductors 310 and 316 may be selected from the group consisting of SiGe, SiC, InP, GaN, polysilicon, and GaAs.

The powering structure 206 has a negative output electrode 314 and a positive output electrode 320.

The energy storage component 208 has a negative terminal 324. In the package body, a dielectric 328 separates the N-type thermoelectric material 310 from the P-type thermoelectric material 316. The negative electrode 314 is coupled to charge the negative terminal 324 of the energy storage component 208. The positive electrode 320 is coupled to charge the positive terminal 326 of the energy storage component 208.

The electric charge stored in the energy storage component 208 can be accessed by the power management unit 334 on the front side of the die 302 by TSV lines 330 (negative) and 332 (positive).

Figure 4:
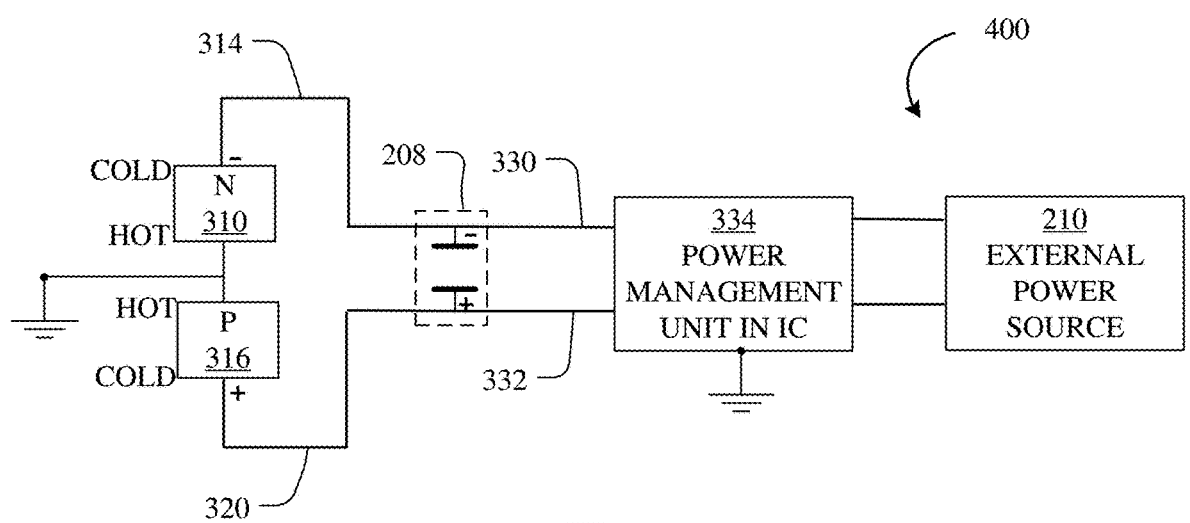
FIG. 4 is a simplified circuit diagram 400 of the thermoelectric IC device 300 in FIG. 3.

FIG. 4 is a simplified circuit diagram 400 of the thermoelectric IC device 300 in FIG. 3. The power management unit 334 is connected both to the energy storage component 208 and external power source 210 for the IC.

Figure 5:
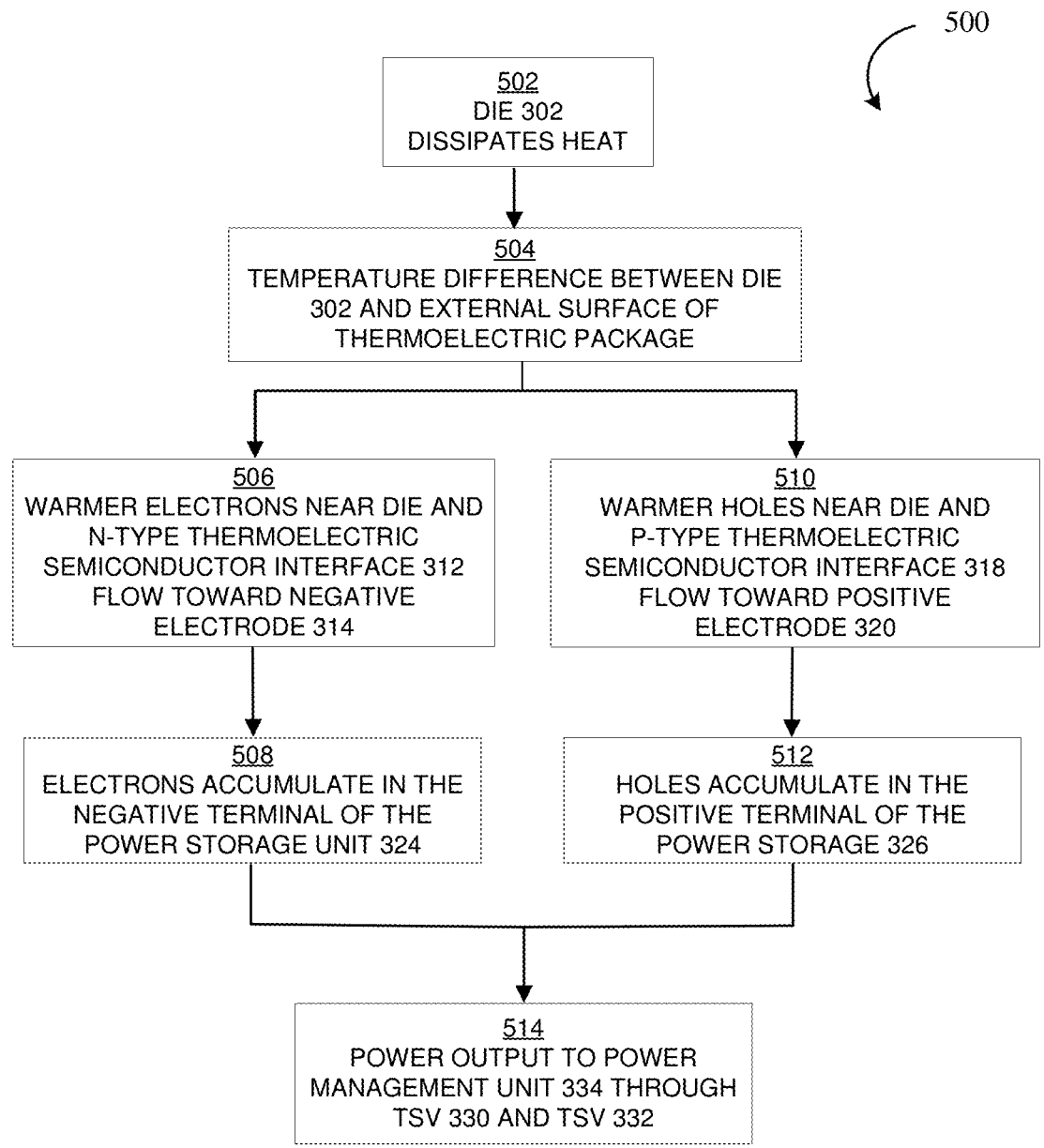
FIG. 5 is a method of operation 500 of the thermoelectric IC device 300 in FIG. 3.

FIG. 5 is a method of operation 500 of the thermoelectric IC device 300 in FIG. 3 for converting the heat dissipated by the die 302 to electrical energy. Heat dissipated by the IC die 302 (step 502) creates a temperature difference between the die 302 and the external cooler surface of the thermoelectric IC device 300 (step 504). Warmer electrons in the N-type thermoelectric material 310 near the die and N-type thermoelectric material interface 312 flow towards the negative electrode 314 (step 506) and accumulates in the negative terminal of the energy storage component 324 (step 508). Warmer holes in the p-type thermoelectric material 316 near the die and P-type thermoelectric material interface 318 flow towards the positive electrode 320 (step 510) and accumulates in the positive terminal of the energy storage component 326 (step 512). The accumulation of negative charge in the negative terminal of the energy storage component 324 and the accumulation of positive charge in the positive terminal of the energy storage component 326 charges the energy storage component 208 with electrical energy (step 508 and step 512). The electric charge stored in the energy storage component 208 can be accessed by the power management unit 334 in the IC die 302 by TSV lines 330 (negative) and 332 (positive) (step 514).

Figure 6:
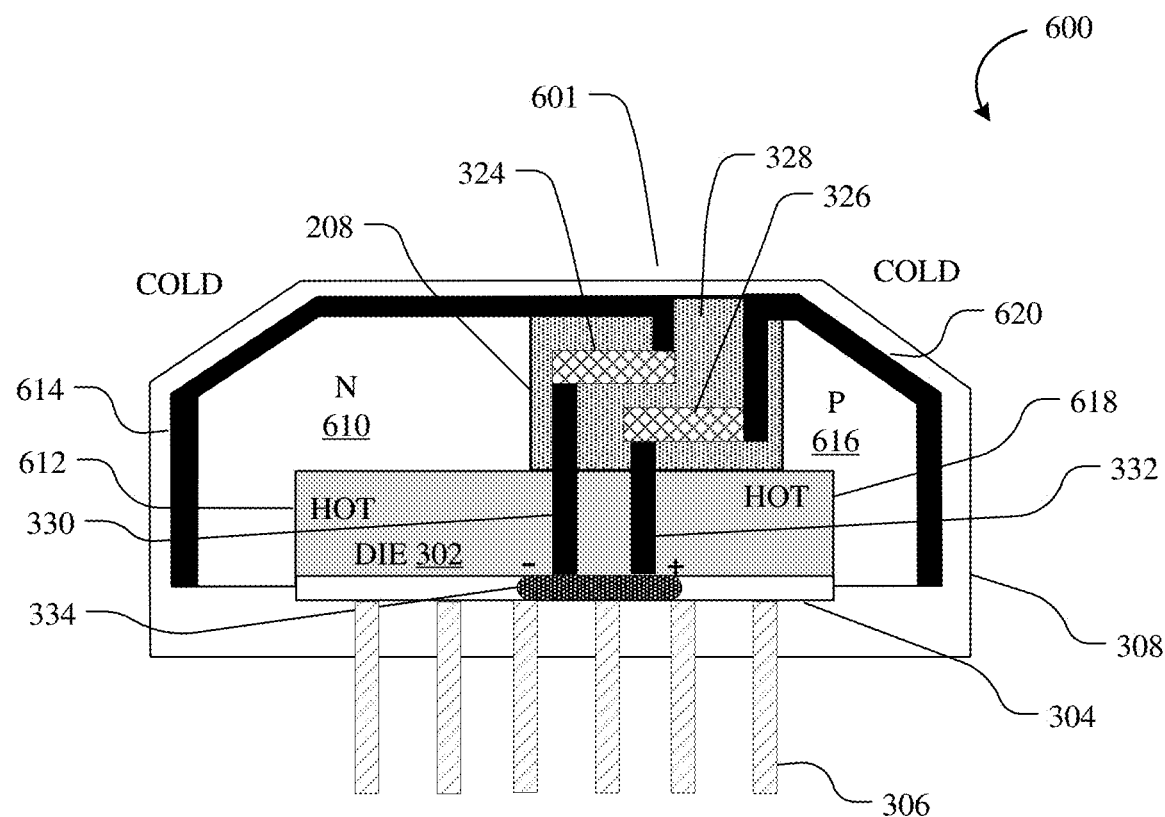
FIG. 6 is a cross sectional view symbolically illustrating a second example thermoelectric IC device 600 with packaging formed by first and second thermoelectric materials (N-type and P-type) where the body of first thermoelectric material is larger than the body of the second thermoelectric material.

In the above disclosed embodiment, the N-type thermoelectric material 310 roughly covers half of the back side (upward facing surface in the diagram) of the die 302 and the P-type thermoelectric material 316 covers the rest. FIG. 6 is a cross sectional view illustrating a second example thermoelectric IC device 600 having a package body 601. The package body 601 consists of first and second thermoelectric materials where the body of one thermoelectric material is bigger than the other. In thermoelectric IC device 600, the N-type thermoelectric material 610 covers more than half of the back side of the die 302 (interface 612) than the P-type thermoelectric material 616 (interface 618), e.g., 1.5-3× more area. The negative electrode 614 is formed with substantially more area than the positive electrode 620, e.g., 1.5-3× more area.

The ratio of N-type thermoelectric semiconductor vs P-type thermoelectric semiconductor utilized in the thermoelectric IC package does not have a large effect on performance. The more significant factors are an overall difference between an accumulated positive charge and an accumulated negative charge in the energy storage component 208 of the thermoelectric IC package.

In FIGS. 3 and 6, the N and P doped semiconductor materials are shown as being in electrical contact with the back side of the die 302. Typically a die is electrically conductive, and is connected to ground. In such a scenario, the positive and negative voltages generated by the thermoelectric package materials will straddle ground potential. In an embodiment in which that is not desired, a dielectric can be inserted to separate the die from the packaging materials. Preferably, the package body is formed with a recess to accept the die, and a thermally conductive adhesive is used to retain it. An adhesive that is or is not also electrically conductive can be used depending on whether it is desired that the inner surface of the package body be electrically connected to the die. The same is true for all embodiments shown herein.

Figure 7:
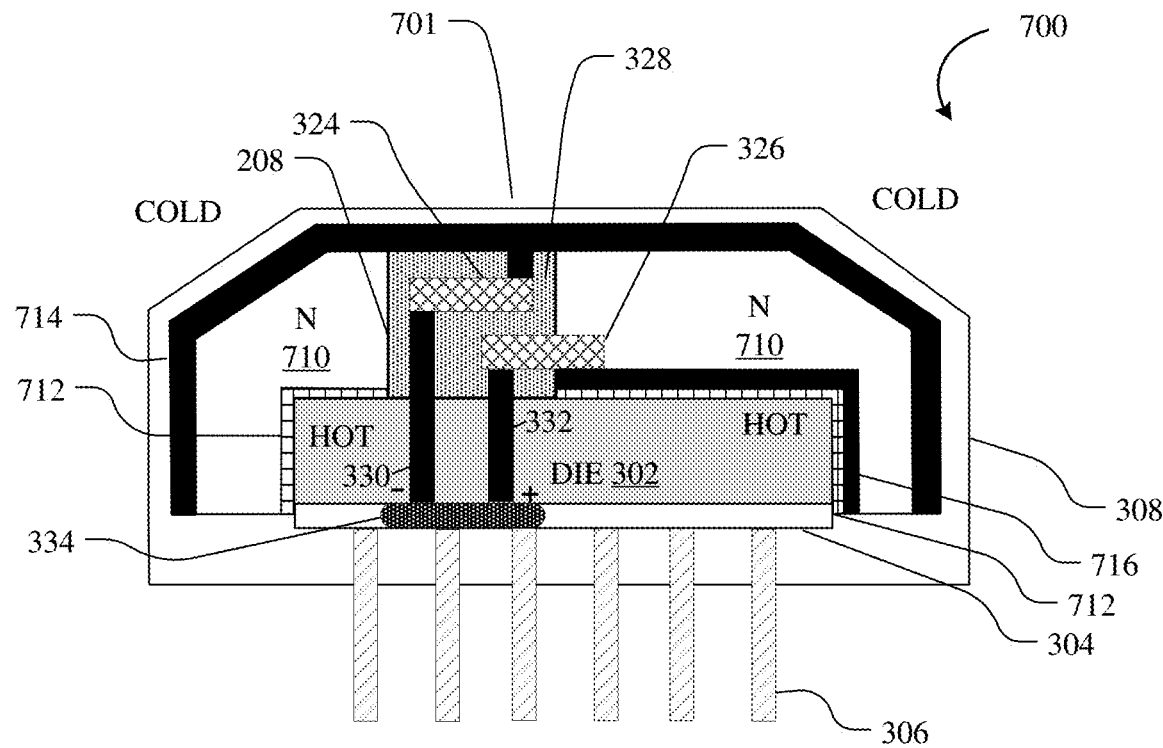
FIG. 7 is a cross sectional view symbolically illustrating a third example thermoelectric IC device 700 with packaging formed by a first N-type thermoelectric material.

FIG. 7 is a cross sectional view illustrating a third example thermoelectric IC device 700 with a package body 701 having only N-type thermoelectric material. The thermoelectric generator 204 inside the thermoelectric IC device 700 comprises an N-type thermoelectric material 710. The N-type thermoelectric material 710 is a semiconductor with thermal conductivity 1/300 to 1/3 that of the thermal conductivity of Silicon. The thermoelectric material 710 may be selected from the group consisting of SiGe, SiC, InP, GaN, polysilicon, and GaAs. The N-type thermoelectric material 710 is separated from the die 302 by a dielectric layer 712 compromises of a dielectric with low electrical conductivity and high thermal conductivity.

The powering structure 206 consists of a negative electrode 714. The energy storage component 208 has a negative terminal 324 and a positive terminal 326. Dielectric 328 isolates the negative terminal 324 from the die 302 and the N-type thermoelectric material 710. The dielectric 328 also isolates the positive terminal 326 from the die 302. The positive terminal 326 is connected to an electrode 716 coating the inner surface of the N-type thermoelectric material 710 and supplying positive voltage. The negative electrode 714 is coupled to charge the negative terminal 324 of the energy storage component 208. The body of thermoelectric material 710 is a unitary structure, since there is no need to electrically isolate N and P doped portions. Electrical conductivity from the outer electrode 714 to the TSV 330 may be provided through a hole in the body which is electrically insulated from the thermoelectric material 710.

Figure 8:
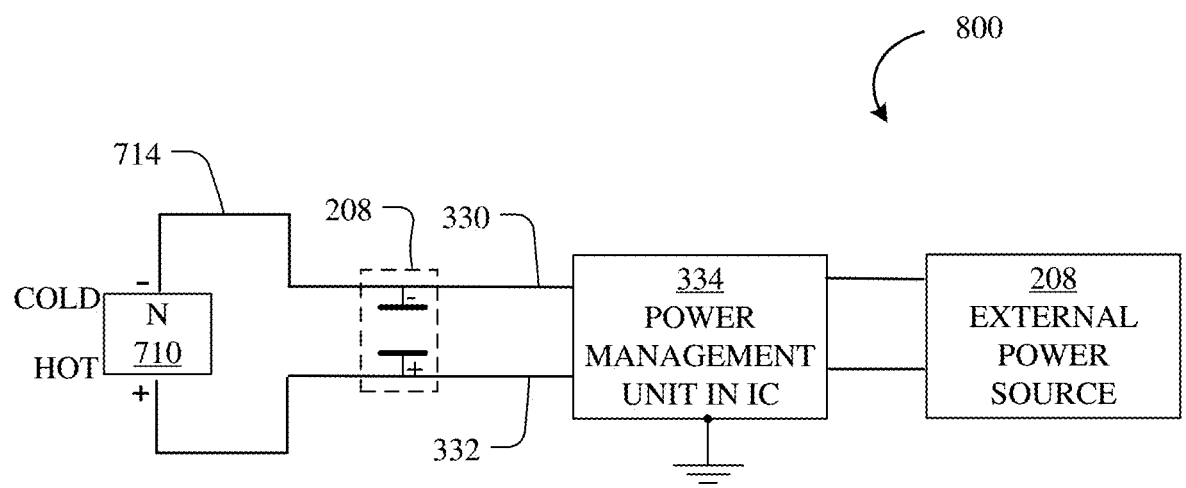
FIG. 8 is a simplified circuit diagram 800 of the thermoelectric IC device 700 in FIG. 7.

The electric charge stored in the energy storage component 208 can be accessed by the power management unit 334 on the front side of the die 302 by TSV lines 330 (negative) and 332 (positive). FIG. 8 is a simplified circuit diagram 800 of the thermoelectric IC 700 package in FIG. 7.

Figure 9:
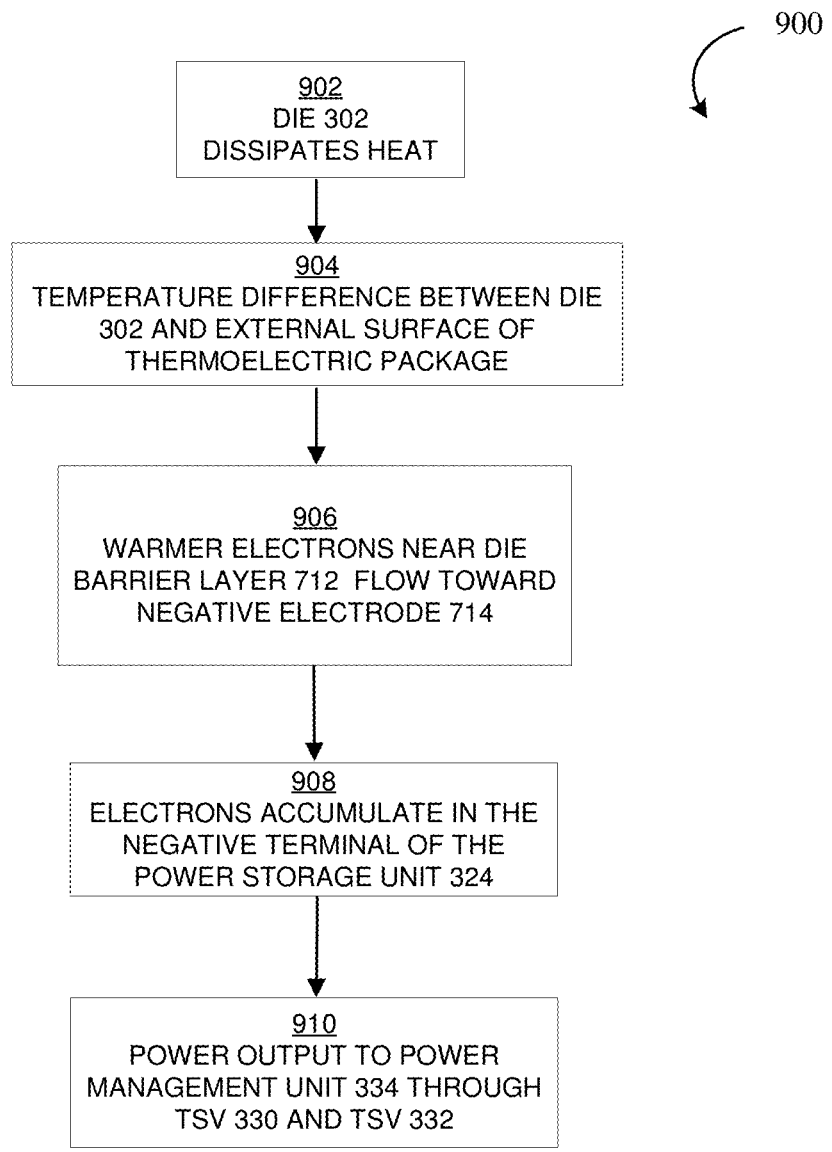
FIG. 9 is a method of operation 900 of the thermoelectric IC device 700 in FIG. 7.

FIG. 9 is a method of operation 900 of the thermoelectric IC device 700 in FIG. 7. Heat dissipated by the IC die 302 (step 902) creates a temperature difference between the die 302 and the external cooler surface of the thermoelectric IC device 700 (step 904). Warmer electrons in the N-type thermoelectric material 710 near the barrier layer 712 flow towards the negative electrode 714 (step 906) and accumulates in the negative terminal of the energy storage component 324 (step 908). The accumulation of negative charge in the negative terminal of the energy storage component 324 charges the energy storage component 208 with electrical energy (step 908). The electric charge stored in the energy storage component 208 can be accessed by the power management unit 334 in the IC die 302 by TSV lines 330 (negative) and 332(positive) (step 910).

Figure 10:
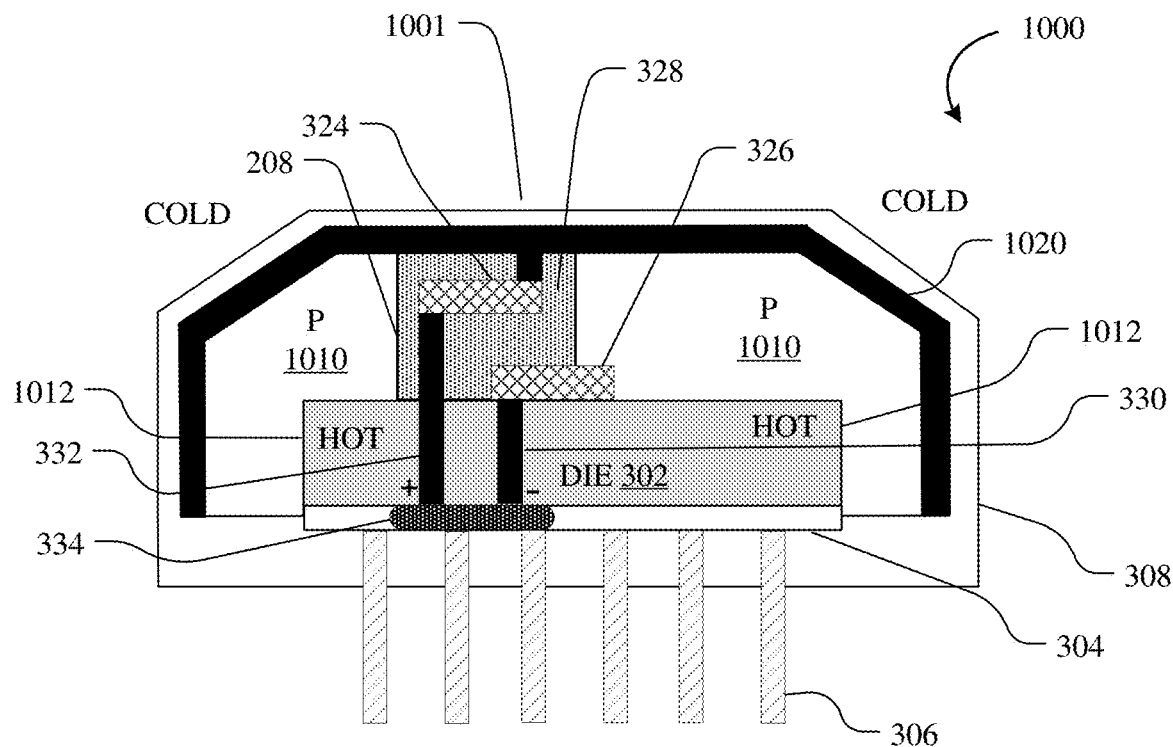
FIG. 10 is a cross sectional view symbolically illustrating a fourth example thermoelectric IC device 1000 with packaging formed by a first P-type thermoelectric material.

FIG. 10 is a cross sectional view illustrating a fourth example thermoelectric IC device 1000. The thermoelectric generator 204 inside the thermoelectric IC device 1000 comprises a P-type thermoelectric material 1010. The thermoelectric material is a semiconductor with thermal conductivity 1/300 to 1/3 that of the thermal conductivity of Silicon. The thermoelectric material 1010 may be selected from the group consisting of SiGe, SiC, InP, GaN, polysilicon, and GaAs.

The powering structure 206 includes a positive electrode 1020 coating the outer surface of the P-type semiconductor material 1010.

The energy storage component 208 has a positive terminal 324 and a negative terminal 326. A dielectric 328 isolates the positive terminal 324 from the die 302. As in FIG. 7, the body 1001 in FIG. 10 is a unitary structure, and electrical conductivity from the outer electrode 1020 to the TSV 332 may be provided through a hole in the body. However, the negative terminal 326 is electrically connected to the die 302 where the die 302, which may be grounded. The negative terminal 326 is also electrically connected to the hot (inner) surface of the P-type thermoelectric material 1010. The positive electrode 1020 is coupled to charge the positive terminal 324 of the energy storage component 208.

The electric charge stored in the energy storage component 208 can be accessed by the power management unit 334 on the front side of the die 302 by TSV lines 330 (negative) and 332 (positive).

Figure 11:
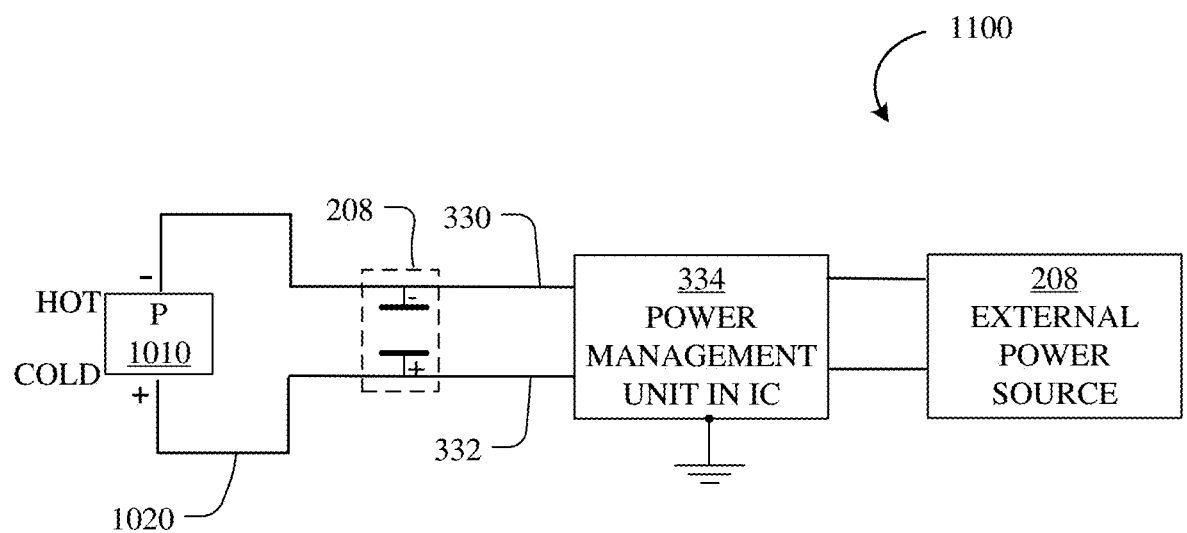
FIG. 11 is a simplified circuit diagram 1100 of the thermoelectric IC 1000 package in FIG. 10.

FIG. 11 is a simplified circuit diagram 1100 of the thermoelectric IC 1000 package in FIG. 10.

Figure 12:
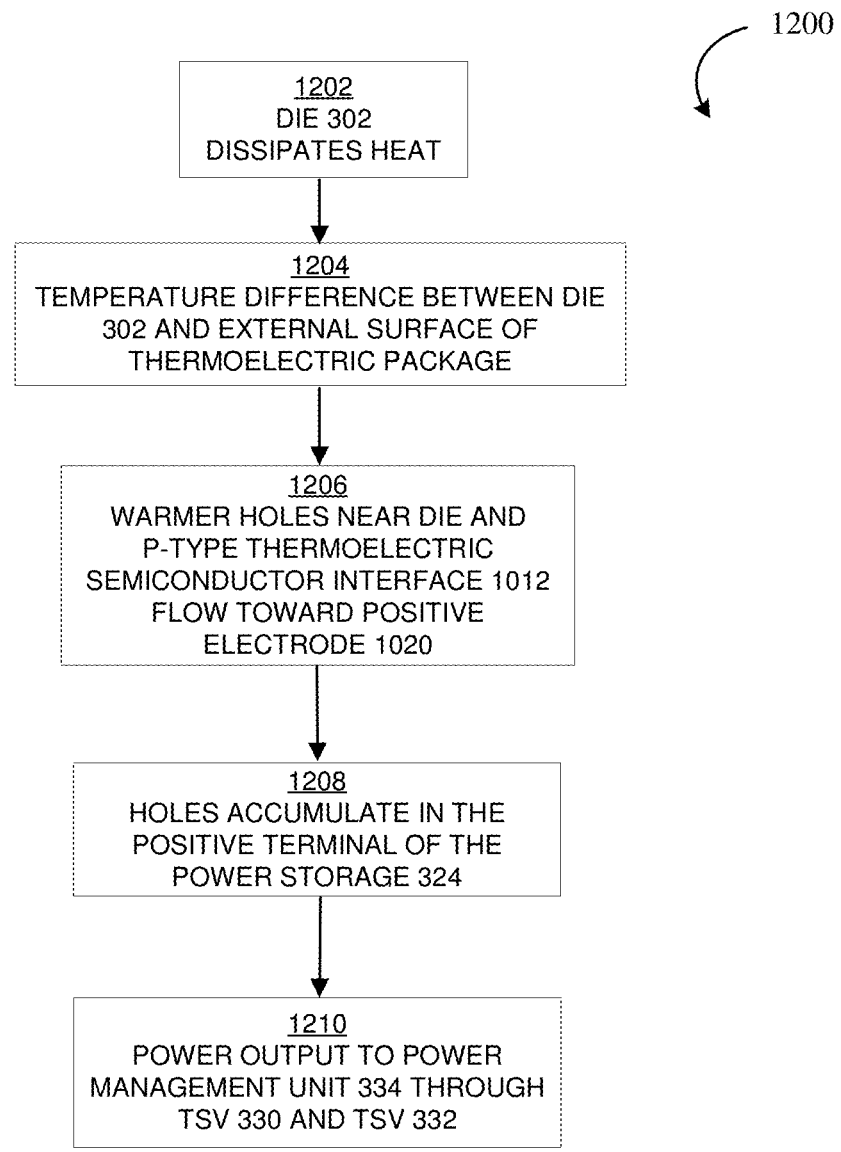
FIG. 12 is a method of operation 1200 of the thermoelectric IC device 1000 in FIG. 10.

FIG. 12 is a method of operation 1200 of the thermoelectric IC device 1000 in FIG. 10 for converting the heat dissipated by the die 302 to electrical energy. Heat dissipated by the IC die 302 (step 1202) creates a temperature difference between the die 302 and the external cooler surface of the thermoelectric IC device 1000 (step 1204). Warmer holes in the p-type thermoelectric material 1010 near the die and P-type thermoelectric material interface 1012 flow towards the positive electrode 1020 (step 1206) and accumulates in the positive terminal of the energy storage component 324 (step 1208). The accumulation of positive charge in the positive terminal of the energy storage component 324 charges the energy storage component 208 with electrical energy (step 1208). The electric charge stored in the energy storage component 208 can be accessed by the power management unit 334 in the IC die 302 by TSV lines 330 (negative) and 332(positive) (step 1210).

Other thermoelectric generators having a suitable geometry and power output can also be used to generate electrical power from the heat generated by the integrated circuit. For example, whereas the thermoelectric semiconductor materials in FIGS. 3, 6, 7 and 10 are doped, other undoped semiconductor materials can be used instead if, for example, they have sufficient free carriers available to flow in response to the temperature gradient.

A thermoelectric device according to the invention can be made as follows.

An integrated circuit die is provided having an integrated circuit thereon. The integrated circuit has power supply terminals for connection to a primary power source. Optionally, a capacitor or other energy storage device is attached to the die, for example on its backside surface. An integrated circuit package is then provided, which includes a body which includes a semiconductor material. The body has outer and inner surfaces. The integrated circuit die is attached to the inner surface of the body, and at least a first portion of the outer surface of the body is electrically connected to the first capacitor electrode. The method can also include electrically connecting the inner surface of the body to the second capacitor electrode.

In one embodiment, all the semiconductor material in the body is either N-doped semiconductor or P-doped semiconductor; and the first portion of the outer surface of the body is the entire outer surface of the body. In another embodiment, a first portion of the semiconductor material in the body is N-doped semiconductor and a second portion is P-doped semiconductor; and the first portion of the outer surface of the body covers only one of the two portions of the body.

When the die is attached to the inner surface of the body, this can be accomplished by the use of an electrically insulating and thermally conductive adhesive. Alternatively, in another embodiment, the adhesive can be both electrically and thermally conductive.

Electrically connecting the first portion of the outer surface of the body to the first capacitor electrode can include coating the outer surface of the body with an electrically conductive coating and connecting it to the first capacitor electrode. Furthermore, in any embodiment, the conductive coating on the outer surface of the package body material can be further coated with a dielectric coating for protection against external contaminants.

In some embodiments the body can include a first body portion that is N-doped semiconductor and a second body portion that is P-doped semiconductor. The body further includes a dielectric material between the first and second body portions. The first body portion has an outer surface (which is the first portion of the outer surface of the body as mentioned above), and an inner portion coincident with a first portion of the inner surface of the body. The second body portion also has an outer surface coincident with a second portion of the outer surface of the body, and further has an inner surface coincident with a second portion of the inner surface of the body. Electrically connecting the first portion of the outer surface of the body to the first capacitor electrode can involve coating the outer surface of the first body portion with a first electrically conductive coating and connecting the first electrically conductive coating to the first capacitor electrode. In addition, the outer surface of the second body portion can be coated with a second electrically conductive coating and the second electrically conductive coating can be connected to the second capacitor electrode.

In the above description, of how a thermoelectric device according to the invention can be made, as well as in all flowcharts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the above description and the flow charts herein show only steps that are pertinent to an understanding of the invention, and it will be understood that in a specific embodiment, numerous additional steps for accomplishing other functions for that embodiment can be performed before, after and between those steps shown.

It should be appreciated that the electrical energy generated by the thermoelectric generator may also be advantageously used for other purposes in addition to powering the integrated circuit described above. For example, the electrical energy may be used to charge a backup battery for a sensor, or the like, or to drive a low power display.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference in the Background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A device comprising:
   an integrated circuit die having an integrated circuit thereon, the integrated circuit having power terminals for connection to a primary power source, a thermoelectric generator structure disposed in sufficient thermal communication with the integrated circuit die so as to derive, from heat generated by the integrated circuit die, a voltage difference across first and second terminals; and a powering structure comprising an energy storage component including the first and second terminals, the powering structure being arranged to help power the integrated circuit, from the voltage difference across the first and second terminals of the energy storage component, wherein the thermoelectric generator structure comprises a package having a recessed inner surface for receiving the integrated circuit die, and an outer surface, the package comprising:

an N-doped semiconductor material, having an inner surface in thermal communication with a first portion of the recessed inner surface of the package, and further having an outer surface spaced from the inner surface and coated at least partially with a first voltage supply conductor which is in electrical communication with the first terminal of the energy storage component, the N-doped semiconductor material having a bulk thermal conductivity which is lower than that of silicon;

a P-doped semiconductor material, having an inner surface in thermal communication with a second portion of the recessed inner surface of the package, and further having an outer surface spaced from the inner surface, the P-doped semiconductor material having a bulk thermal conductivity which is lower than that of silicon; and a dielectric region separating the N-doped semiconductor material from the P-doped semiconductor material, the first voltage supply conductor being connected to the first terminal of the energy storage component within the dielectric region separating the N-doped semiconductor material from the P-doped semiconductor material, wherein the outer surface of the P-doped semiconductor material is coated at least partially with a second voltage supply conductor being connected to the second terminal of the energy storage component within the dielectric region separating the N-doped semiconductor material from the P-doped semiconductor material.

2. The device of claim 1, wherein the energy storage component comprises a capacitor mounted on the integrated circuit die.

3. The device of claim 1, wherein the powering structure comprises a voltage converter having an input port connected to the first and second terminals of the energy storage component, and having an output port coupled to help power the integrated circuit.

4. The device of claim 3, wherein at least part of the voltage converter is part of the integrated circuit.

5. The device of claim 1, wherein the N-doped semiconductor material and the P-doped semiconductor material each have a respective bulk thermal conductivity which is between $1/300$ to $1/3$ of the bulk thermal conductivity of silicon.

6. The device of claim 1, wherein the inner surface of the N-doped semiconductor material is connected electrically to the integrated circuit die.

7. A method for making a structure, comprising:

providing an integrated circuit die having an integrated circuit thereon, the integrated circuit having power supply terminals for connection to a primary power source;

disposing a thermoelectric generator structure in sufficient thermal communication with the integrated circuit die so as to derive, from heat generated by the integrated circuit die, a voltage difference across first and second terminals; and forming a powering structure comprising an energy storage component including the first and second terminals, the powering structure being arranged to help power the integrated circuit, from the voltage difference across the first and second terminals of the energy storage component, wherein disposing a thermoelectric generator structure comprises:
providing an integrated circuit package including a body which includes at least a first semiconductor material, the body having outer and inner surfaces;
attaching the integrated circuit die to the inner surface of the body; and
electrically connecting at least a first portion of the outer surface of the body to the first terminal of the energy storage component, wherein the body includes a first body portion that is an N-doped semiconductor and having an outer surface spaced from an inner surface and coated at least partially with a first voltage supply conductor which is in electrical communication with the first terminal of the energy storage component, and a second body portion that is a P-doped semiconductor, wherein the body includes a dielectric region separating the N-doped semiconductor from the P-doped semiconductor, the first voltage supply conductor being connected to the first terminal of the energy storage component within the dielectric region separating the N-doped semiconductor from the P-doped semiconductor, and wherein an outer surface of the P-doped semiconductor is coated at least partially with a second voltage supply conductor being connected to the second terminal of the energy storage component within the dielectric region separating the N-doped semiconductor from the P-doped semiconductor.

8. The method of claim 7, wherein forming a powering structure comprises attaching a capacitor to the die, the capacitor having first and second electrodes connected respectively to the first and second terminals of the energy storage component.

9. The method of claim 7, wherein attaching the integrated circuit die to the inner surface of the body comprises attaching the integrated circuit die using an electrically insulating and thermally conductive adhesive.

10. The method of claim 7, wherein the first body portion includes an outer surface being the first portion of the outer surface of the body and an inner portion coincident with a first portion of the inner surface of the body, and the second body portion includes an outer surface coincident with a second portion of the outer surface of the body and an inner surface coincident with a second portion of the inner surface of the body.

11. The method of claim 10, wherein electrically connecting the first portion of the outer surface of the body to the first terminal of the energy storage component comprises coating the outer surface of the first body portion with a first electrically conductive coating to form the first voltage supply conductor and connecting the first electrically conductive coating to the first terminal of the energy storage component, further comprising coating the outer surface of the second body portion with a second electrically conductive coating to form the second voltage supply conductor and connecting the second electrically conductive coating to the second terminal of the energy storage component.

12. The device of claim 1, wherein the second voltage supply conductor is connected to the second terminal of the energy storage component within the dielectric region separating the N-doped semiconductor material from the P-doped semiconductor material.

13. The device of claim 12, wherein the integrated circuit die has an active surface and a rear surface opposite the active surface,
wherein the integrated circuit die is packaged with its rear surface facing the recessed inner surface of the package,
and wherein the integrated circuit die includes first and second through-silicon vias by which first and second points on the recessed inner surface of the package are electrically connected to respective first and second points on the active surface of the integrated circuit die.

14. The device of claim 1, wherein the integrated circuit die has an active surface and a rear surface opposite the active surface,
and wherein the integrated circuit die is packaged with its rear surface facing the recessed inner surface of the package.

15. The device of claim 14, wherein the inner surface of the N-doped semiconductor material and the inner surface of the P-doped semiconductor material are both in electrical contact with the rear surface of the integrated circuit die.

16. The device of claim 15, wherein the rear surface of the integrated circuit die is grounded.

17. The device of claim 1, wherein the inner surface of the N-doped semiconductor material and the inner surface of the P-doped semiconductor material are connected together electrically.

18. The device of claim 17, wherein the inner surface of the N-doped semiconductor material and the inner surface of the P-doped semiconductor material are connected together and to a ground of the powering structure.

19. The device of claim 18, wherein the N- and P-doped semiconductor materials are members of the group consisting of SiGe, SiC, InP, GaN, polysilicon, and GaAs.

20. The device of claim 1, wherein at least one of the N-doped semiconductor material and P-doped semiconductor material has a thickness of approximately 0.5 mm, measured from an upper surface of the integrated circuit die to an external upper surface of the device.

21. The device of claim 1,
wherein the N-doped semiconductor material and the P-doped semiconductor material generate a temperature gradient of 100 K, and
wherein at least one of the N-doped semiconductor material and P-doped semiconductor material has a thickness of approximately 0.5 mm, measured from an upper surface of the integrated circuit die to an external upper surface of the device.

\* \* \* \* \*